US010002842B2

(12) United States Patent
Marion (10) Patent No.: US 10,002,842 B2
(45) Date of Patent: Jun. 19, 2018

(54) METHOD OF PRODUCING A HYBRIDIZED DEVICE INCLUDING MICROELECTRONIC COMPONENTS

(71) Applicant: Commissariat A L'Energie Atomique Et Aux Energies Alternatives, Paris (FR)

(72) Inventor: François Marion, Saint Martin le Vinoux (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 115 days.

(21) Appl. No.: 15/132,711

(22) Filed: Apr. 19, 2016

(65) Prior Publication Data

US 2016/0233186 A1    Aug. 11, 2016

Related U.S. Application Data

(60) Division of application No. 14/088,698, filed on Nov. 25, 2013, now abandoned, which is a continuation of
(Continued)

(30) Foreign Application Priority Data

Jun. 30, 2011    (FR) ..................... 11 55916

(51) Int. Cl.
*H01L 23/00* (2006.01)
*H01L 25/065* (2006.01)
(Continued)

(52) U.S. Cl.
CPC .............. *H01L 24/11* (2013.01); *H01L 24/13* (2013.01); *H01L 24/16* (2013.01); *H01L 24/81* (2013.01);
(Continued)

(58) Field of Classification Search
CPC ......... H01L 24/11; H01L 24/13; H01L 24/16; H01L 24/81; H01L 25/0657; H01L 25/50; H05K 3/10
See application file for complete search history.

(56) References Cited

U.S. PATENT DOCUMENTS 8,093,728 B2    1/2012  Marion
8,898,896 B2    12/2014 Marion et al.
(Continued)

FOREIGN PATENT DOCUMENTS

| FR | 2 928 033 A1 | 8/2009 |
| FR | 2 936 359 A1 | 3/2010 |
| JP | 04-010446 A1 | 1/1992 |

OTHER PUBLICATIONS

International Search Report dated Oct. 16, 2012.

*Primary Examiner* — Paul D Kim
(74) *Attorney, Agent, or Firm* — Burr & Brown, PLLC (57) ABSTRACT

A method of producing a hybridized device including two microelectronic components, including a first microelectronic component having conductive inserts on a connection surface, and a second microelectronic component having ductile conductive pads on a surface opposed to the connection surface, is provided. The method includes the steps of hybridizing the first and second electronic components face-to-face by arranging the connection surface of the first microelectronic component to oppose the surface of the second microelectronic component having the ductile conductive pads, and establishing an electro-mechanical connection between the first microelectronic component and the second microelectronic component by inserting, at ambient temperature, inserts of the first microelectronic component, provided with a second metal sub-layer, into the ductile conductive pads of the second microelectronic component.

9 Claims, 7 Drawing Sheets

Related U.S. Application Data application No. PCT/FR2012/051460, filed on Jun. 26, 2012.

(51) Int. Cl.
  *H01L 25/00* (2006.01)
  *H05K 3/10* (2006.01)

(52) U.S. Cl.
  CPC .......... *H01L 25/0657* (2013.01); *H01L 25/50* (2013.01); *H05K 3/10* (2013.01); *H01L 2224/114* (2013.01); *H01L 2224/116* (2013.01); *H01L 2224/1147* (2013.01); *H01L 2224/1161* (2013.01); *H01L 2224/11452* (2013.01); *H01L 2224/11614* (2013.01); *H01L 2224/11827* (2013.01); *H01L 2224/11901* (2013.01); *H01L 2224/13011* (2013.01); *H01L 2224/1318* (2013.01); *H01L 2224/13019* (2013.01); *H01L 2224/13023* (2013.01); *H01L 2224/13109* (2013.01); *H01L 2224/13111* (2013.01); *H01L 2224/13116* (2013.01); *H01L 2224/13118* (2013.01); *H01L 2224/13124* (2013.01); *H01L 2224/13139* (2013.01); *H01L 2224/13147* (2013.01); *H01L 2224/13155* (2013.01); *H01L 2224/13166* (2013.01); *H01L 2224/13172* (2013.01); *H01L 2224/13184* (2013.01); *H01L 2224/13566* (2013.01); *H01L 2224/13582* (2013.01); *H01L 2224/13624* (2013.01); *H01L 2224/13687* (2013.01); *H01L 2224/16145* (2013.01); *H01L 2224/81099* (2013.01); *H01L 2224/81193* (2013.01); *H01L 2224/81208* (2013.01); *H01L 2224/81355* (2013.01); *H01L 2224/81801* (2013.01); *H01L 2225/06513* (2013.01); *H01L 2924/0103* (2013.01); *H01L 2924/0105* (2013.01); *H01L 2924/01005* (2013.01); *H01L 2924/01013* (2013.01); *H01L 2924/01019* (2013.01); *H01L 2924/01023* (2013.01); *H01L 2924/01029* (2013.01); *H01L 2924/01042* (2013.01); *H01L 2924/01047* (2013.01); *H01L 2924/01049* (2013.01); *H01L 2924/01057* (2013.01); *H01L 2924/01058* (2013.01); *H01L 2924/01074* (2013.01); *H01L 2924/01078* (2013.01); *H01L 2924/01079* (2013.01); *H01L 2924/01082* (2013.01); *H01L 2924/01087* (2013.01); *Y10T 29/49117* (2015.01)

(56) References Cited

U.S. PATENT DOCUMENTS

| | | |
|---|---|---|
| 2004/0197979 A1 | 10/2004 | Jeong |
| 2005/0104222 A1 | 5/2005 | Jeong |
| 2005/0151273 A1 | 7/2005 | Arnold |
| 2007/0148817 A1 | 6/2007 | Williams |
| 2010/0072631 A1 | 3/2010 | Marion |
| 2011/0094789 A1 | 4/2011 | Marion et al. |

METHOD OF PRODUCING A HYBRIDIZED DEVICE INCLUDING MICROELECTRONIC COMPONENTS

CROSS-REFERENCE TO RELATED APPLICATIONS

This application is a divisional of U.S. patent application Ser. No. 14/088,698, filed Nov. 25, 2013 now abandoned, the entirety of which is incorporated herein by reference, which is a continuation of PCT/FR2012/051460, filed Jun. 26, 2012, and claims the benefit under 35 USC § 119 (a)-(d) of French Application No. 11.55916 filed Jun. 30, 2011.

FIELD OF THE INVENTION

The invention relates to the connection of two components according to the flip-chip technique, and more specifically to the connection of two electronic components by insertion at ambient temperature of metal-type inserts in a metal forming pads.

The invention thus specifically applies in so-called chip-on-chip, chip-on-wafer, and wafer-on-wafer assemblies.

DESCRIPTION OF RELATED ART

To replace flip-chip hybridizations with solder balls, it is known to provide on a surface of a first electronic component inserts made of a hard metal, for example, titanium nitride, and on a surface of a second electronic components, pads made of a ductile metal, for example, silver, and then to hybridize the two components by inserting at low temperature the inserts into the pads, which thus creates mechanical and electrical interconnects between components.

Figure 1:
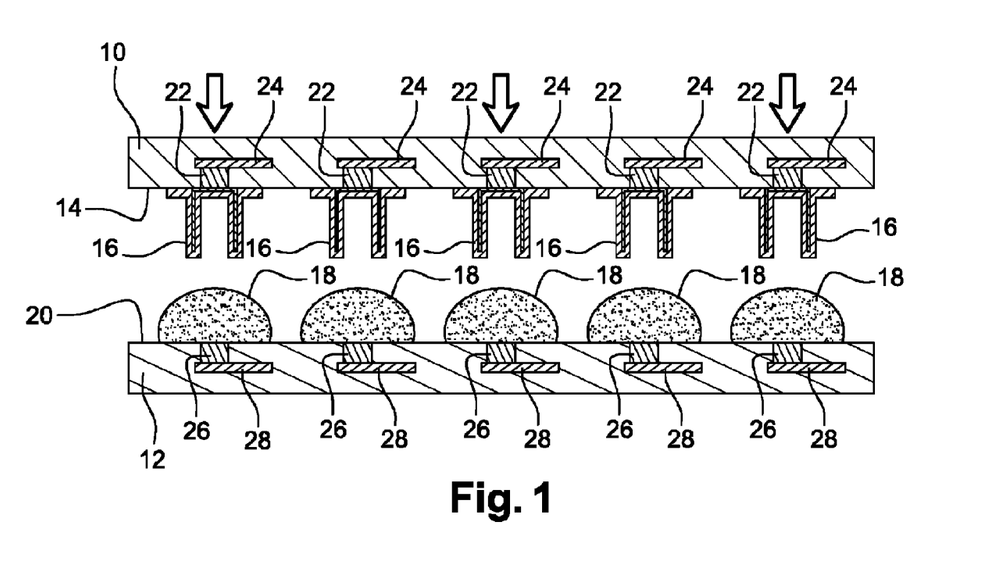
FIGS. 1 and 2 are simplified cross-section views of the hybridizing of a first and of a second microelectronic components by insertion of inserts into pads.
Figure 2:
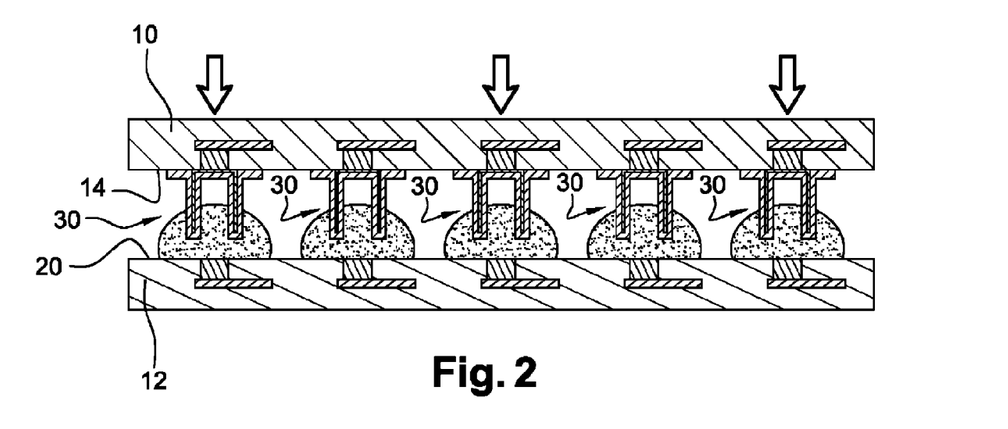

FIGS. 1 and 2 schematically illustrate the flip-chip hybridization of a first and of a second microelectronic components 10, 12. First component 10 comprises on one or its surface 14 a set of electrically-conductive inserts 16, intended to penetrate into respective electrically-conductive pads 18, pads 18 being arranged on surface 20 of second component 12.

The bottom of each insert 16 is further in contact with a connection area 22 formed in the thickness of first component 10, area 22 forming the interface with, for example, an electronic circuit 24. Similarly, each pad 18 is in contact with a connection area 26 formed in the thickness of second component 12, area 26 forming the interface, for example, with an electronic circuit 28.

To perform the hybridizing, preferably at cold temperature, electronic components 10 and 12 are aligned to present each insert 16 in front of a pad 18, and an appropriate pressure, illustrated by the arrows, is for example exerted on the first component, which is mobile (FIG. 1). Inserts 16, which have a greater hardness than pads 18, then penetrate into them. Interconnects 30 between first and second microelectronic components 10, 12 are thus formed (FIG. 2). Interconnects 30 mechanically fasten components 10, 12 together, while creating electric connections therebetween.

As an example, first component 10 is a detection matrix formed of a plurality of sensitive detection elements, especially for detecting electromagnetic radiation, and second component 12 is a circuit for reading the sensitive elements. Interconnects 30 thus form the electric connection of the read circuit with each of the sensitive elements of first component 10.

However, a recurrent problem in this type of hybridizing by metal-in-metal insertion lies in the fact that, with no specific operation, the insert surface oxidizes, which creates electric connections of poor quality between inserts and the pads into which they are inserted. Indeed, metals adapted for a cold insertion, more commonly "hard" metals, such as for example titanium nitride, are oxidizable.

A solution used to avoid the insertion of oxidized inserts is to manufacture inserts 16, each formed of a central metal core having a greater hardness than pads 18, and to cover this core, before its oxidation, with a layer of a noble metal, which is thus non-oxidizable, such as gold or platinum. The core and the layer of noble metal are thus inserted together into a pad 18 without for oxide capable of affecting the quality of the electric connection to appear.

An example of a method of low cost manufacturing of hollow cylindrical inserts 16 covered with a layer of noble metal is described hereafter in relation with the simplified cross-section views of FIGS. 3 to 10.

Figure 3:
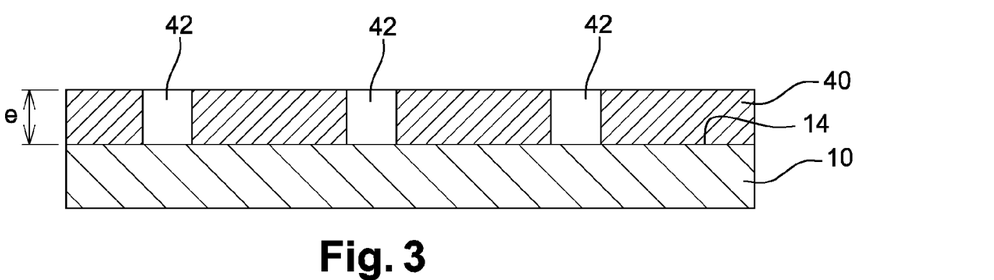
FIGS. 3 to 10 are simplified cross-section views illustrating a method of manufacturing inserts comprising an external layer made of noble metal.

The method starts with the deposition of a sacrificial layer 40 having a thickness e on surface 14 of component 10, for example, a polyimide-type resin layer, followed by a photolithography to form circular holes 42 in sacrificial layer 40 all the way to surface 14 of component 10 (FIG. 3). Thickness e corresponds to the height desired for the insert core and the diameter of circular holes 42 corresponds to the outer diameter of the core.

Figure 4:
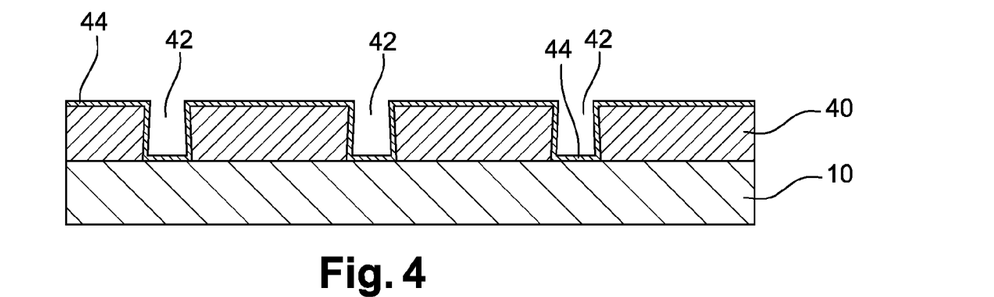

The method carries on with the full-plate deposition of a layer or a multilayer of hard metal 44, for example, titanium nitride or an alloy containing titanium nitride, of a thickness corresponding to the thickness of the core of inserts 16. The deposition is for example a chemical vapor deposition, or CVD, performed at a temperature compatible with the microelectronic elements of component 10, especially a temperature lower than 425° C. for a component 10 implementing a CMOS technology (FIG. 4).

A removal of the portion of hard metal 44 deposited between holes 42 is then performed, for example, by means of a damascene or gap fill etching, well known per se.

Figure 5:
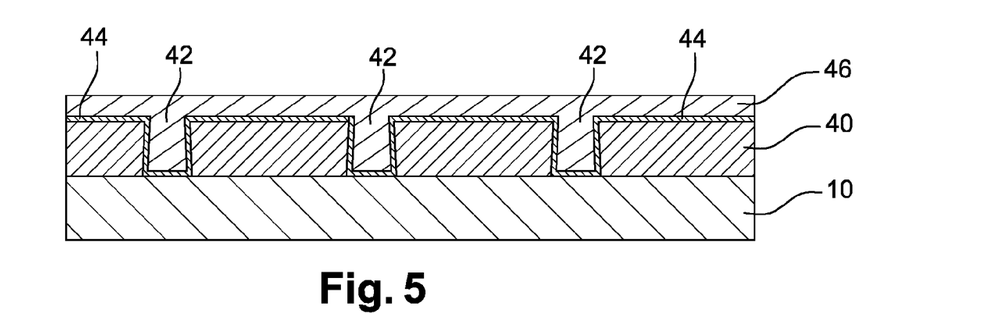
Figure 6:
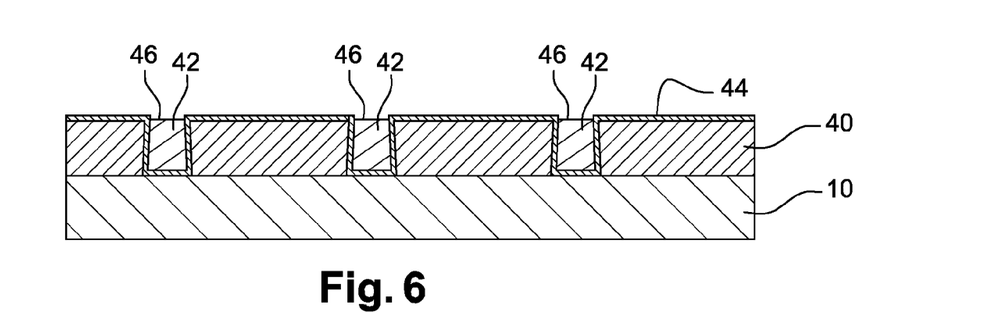
Figure 7:
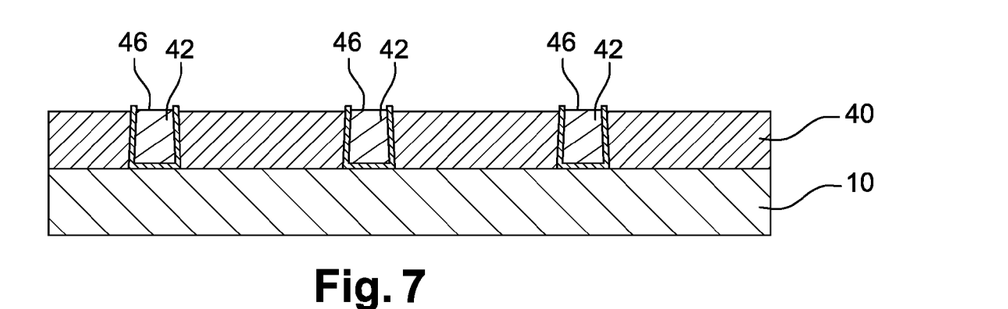

For example, according to the gap-fill etching, a full-plate deposition of fluid resin layer 46 is performed, the layer thus filling holes 42 and planarizing the assembly obtained at the previous step (FIG. 5). Once solidified, resin layer 46 is then uniformly etched, for example, by mechanical or chem.-mech. polishing, until metal layer surface 46 is reached. Holes 42 however remain filled with resin 46 to protect the metal covering them during subsequent steps (FIG. 6). An etching of metal 44 arranged between holes 42 is then implemented in a manner known per se (FIG. 7).

Figure 8:
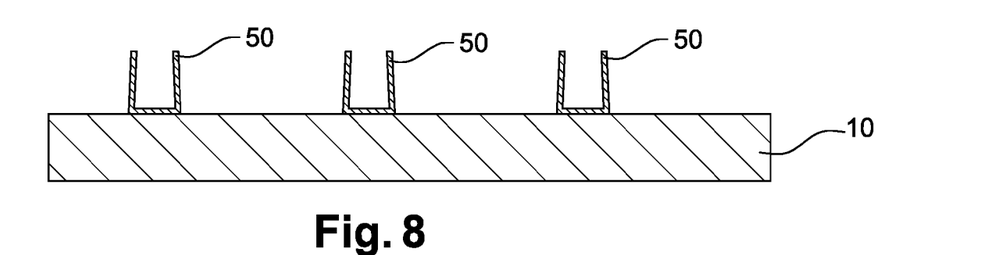
Figure 9:
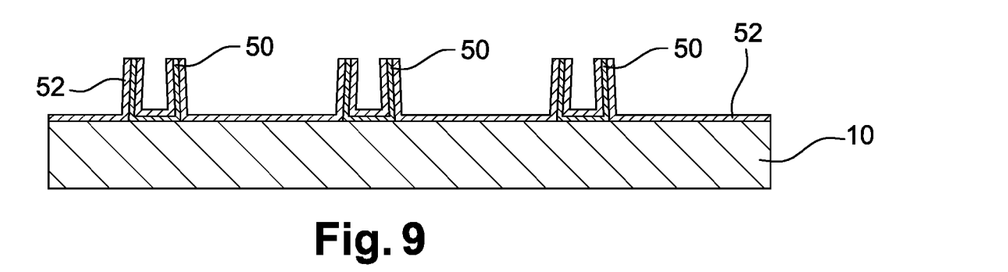

The method then carries on with the removal of resin 46 contained in holes 42, for example, by means of a decoating based on an $O_2$ plasma, followed by the removal of sacrificial layer 40, for example, by means of a decoating based on an $O_2$ plasma (FIG. 8). Cores 50 of inserts 16 are thus formed.

Figure 10:
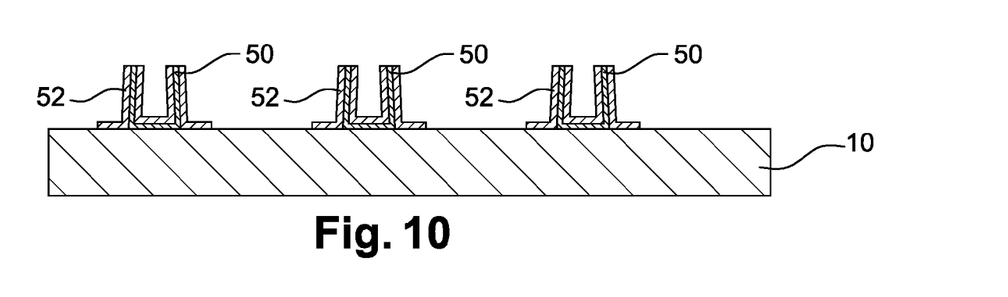

A layer 52 of noble metal, for example a gold or platinum layer, is then deposited full plate, for example, by means of a CVD (FIG. 9), after which the portion of layer 52 placed between cores 50 is removed, for example, by means of the conventional photolithography technique (FIG. 10).

However, this method has a number of disadvantages. First, even though the method has a low cost and provides a high manufacturing efficiency, it implements a large number of complex steps.

Then, this type of method makes it difficult or even impossible to decrease interconnect pitches, that is, the minimum space between two insert/pad interconnects, if low-cost techniques of manufacturing the noble metal layer covering the metal cores of the inserts are used. Indeed, low-cost manufacturing techniques comprise performing a full-plate deposition of a noble metal layer on the surface of the component comprising the inserts, and then etching the noble metal layer present between inserts. Now, the only low-cost etching technique of the state of the art applicable to noble metals such as gold and platinum is a liquid chemical etching which does not enable, to date, to etch surfaces having dimensions smaller than 10 micrometers, or even 15 micrometers. Only an ion machining etching currently enables to etch interconnect pitches smaller than 10 micrometers. However, such a technique has a very low efficiency, especially due to the cleanings required between each deposition, and it thus expensive.

Figures 11, 12:
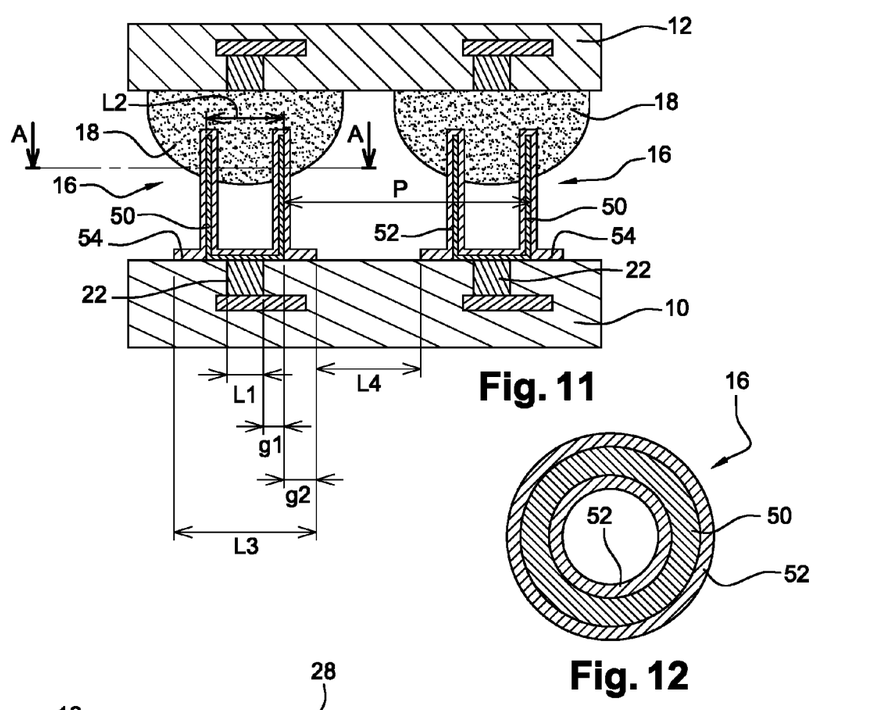
FIG. 11 is a cross-section view of two adjacent inserts manufactured according to the method of FIGS. 3 to 10 and inserted into respective pads.
FIG. 12 is a simplified cross-section of an insert of FIG. 11 according to plane A-A.

This difficulty to decrease the interconnect pitch is illustrated in the simplified cross-section views of FIGS. 11 and 12.

Particularly, as can be seen in FIG. 11, noble metal layer 52 is not totally removed between inserts 16 due to the accuracy of the liquid etching used. A ring of noble metal 54 thus remains around each insert 16.

With the simplified assumption of cylindrical connection areas 22 aligned with their respective inserts 16, minimum interconnect pitch $\underline{P}$ is equal to the sum of width $\underline{L1}$ of connection area 22, of twice width $\underline{G1}$ between the external diameter of core 50 of an insert 16 and the edge of connection area 22, of twice width $\underline{G2}$ between the external diameter of core 50 and the edge of ring 54 surrounding an insert 16, and of width $\underline{L4}$ separating two rings 54 of adjacent inserts 16, that is, P=L1+2G1+2G2+L4.

Width $\underline{L1}$ is mainly determined by the maximum current intended to cross interconnect 30 formed of an insert 16 inserted in a pad 18 and is thus substantially independent from the method of manufacturing inserts 16. A minimum width $\underline{L1}$, for example, in imagers, is 3 micrometers.

Width $\underline{G1}$ depends on the accuracy of the photolithography used to form openings 42 in sacrificial layer 40. By means of current etching techniques, the minimum possible width $\underline{G1}$ is approximately 1 micrometer.

Width $\underline{G2}$ depends on the accuracy of the photolithography used to remove noble metal layer 52 between inserts 16. By means of current etchings, the minimum possible width $\underline{G2}$ is approximately 1 micrometer.

Finally, width $\underline{L4}$ also represents the distance separating two adjacent conductive interconnect elements 30. It can be estimated that a minimum width $\underline{L4}$ of approximately 3 micrometers is appropriate to avoid any risk of short-circuit between interconnects.

Further, noble metals, for example, gold or platinum, are highly reflective, which hinders the photolithographic etching. Further, etch chemistries are very aggressive for circuits, particularly image sensors.

Thus, the minimum interconnect pitch $\underline{P}$ which can currently be achieved is approximately 10 micrometers, that is, an interconnect surface density equal to approximately $10^4$ interconnects/mm².

SUMMARY OF THE INVENTION

The present invention aims at providing inserts enabling to decrease the interconnect pitch and which can be achieved with current manufacturing techniques, as well as at a low-cost method of manufacturing such inserts, and particularly a method also enabling to perform a hybridization of microcomponents at ambient temperature.

For this purpose, an object of the invention is a method for manufacturing an electro-mechanical connection component provided on one connection surface with conductive inserts intended to be inserted at ambient temperature into respective ductile conductive pads formed on a surface of another connection component for a face-to-face type hybridization.

According to the invention, the method comprises, for each insert:
  forming a hollow metal core formed of a bottom arranged on the connection surface and of a lateral wall protruding from the bottom, defining an internal surface of the insert, at least a portion of the internal surface being non-oxidized; and
  forming a metal layer substantially only covering the internal surface of the metal core and intended to be in contact with the pad associated with the insert.

The metal layer is made of an inoxidizable metal, especially a noble metal, or the forming of the metal layer comprises:
  forming a first metal sub-layer non-oxidized over at least a portion of its surface, covering at least the non-oxidized portion of the internal surface of the core, the first sub-layer having a greater plasticity than the core; and
  forming a second sub-layer covering at least the first sub-layer over its non-oxidized portion and having a lower plasticity than the first sub-layer.

"Ambient temperature" here means a temperature remote from the melting temperature of the material forming the first layer and the pads, for example, temperatures on the order of 300° K for which no significant softening of this first layer and of the pads where the inserts are intended to be inserted can be observed. The "cold" or "ambient temperature" hybridization of the invention thus differs from "thermo-compressive"-type hybridizations during which both a pressure and a heating are applied, the heating aiming at softening or melting the pads in order to ease the insertion of inserts.

In other words, it is chosen not to totally cover the central metal core of inserts, but only its hollow portion, and thus to take no specific measure to avoid the oxidation of the external surface of the central core. Avoiding covering the external surface of the core with a layer of noble metal enables to do away with the presence of a ring of noble metal around the inserts.

Indeed, attempting to protect the entire oxidizable surface of the central core by implementing low-cost manufacturing methods, and particularly a full-plate deposition, results in depositing an unwanted metal layer between inserts, which unwanted layer then has to be removed by means of a low-cost etching of limited accuracy. Thus, metal rings are inevitably formed around the inserts, which limits the minimizing of the interconnect pitch.

It should be noted that as large a conductive surface area as possible has been desired up to now for an insert, in order to maximize the quality of the electric interconnect formed of an insert and of a pad. This, in particular, used to be the reason to totally cover the central conductive core with a layer of noble metal to avoid any oxidizing of the core surface. This thus implies, in the context of a low-cost manufacturing, disengaging the central core of the inserts from the sacrificial layer in which it is formed, to perform a full-plate deposition, to totally coat this core with a layer of noble metal.

However, the inventors have observed that this approach is actually based on a technically erroneous assumption, that is, that the external surface and the internal surface of the core define electric paths of similar importance.

Actually, noble metals, and more generally non-oxidizable metals, have a lower electric resistivity than the hard metals used to form the central core. Thus, the current preferably runs through the noble metal layer rather than through the central core.

Figure 13:
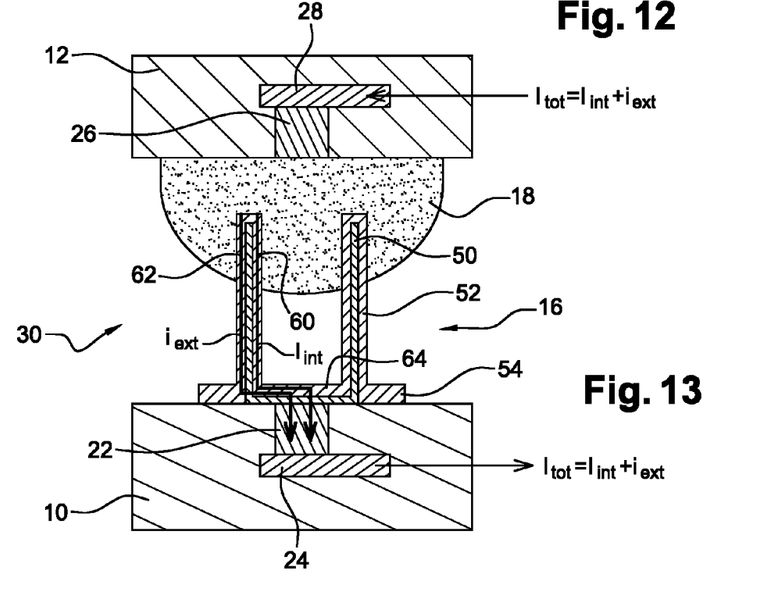
FIG. 13 is a simplified view of an insert manufactured according to the method of FIGS. 3 to 10 and inserted into a pad, illustrating the electric currents in the insert.

Referring to the simplified cross-section view of FIG. 13, when a total current $I_{tot}$ flows through an interconnect 30, for example, a current injected via area 26 of pad 18, total current $I_{tot}$ breaks down into a first current $I_{int}$ flowing in internal portion 60 of noble metal layer 52 and a second current $i_{ext}$ flowing in external portion 62 of layer 52. Now, as can be seen, external current $i_{ext}$ has to cross twice central core 50, which has a greater resistivity than layer 52, to reach connection area 22 of insert 16. However, internal current $I_{int}$ only crosses the core once, at bottom 64 thereof. Measurements thus show that internal current $I_{int}$ amounts to 90% of total current $I_{tot}$ and thus that external current $i_{ext}$ only amounts to 10% of this current.

Thus, external portion 62 of noble metal layer 52 can be considered as a dead arm with a negligible electric conduction and its removal causes no substantial alteration of the electric conduction of an interconnect 30.

Further, according to a first variation, the metal layer being formed of an inoxidizable metal, particularly a noble metal such as gold or platinum, this enables to define a non-oxidized surface at the interface with the pad when the insert is inserted into the pad.

However, this variation has a number of disadvantages, including:
- a high cost due, on the one hand, to the cost of noble metals and, on the other hand, to the great number of complex steps of be implemented to only cover the inserts with a layer of such a metal;
- the impossibility to decrease the interconnect pitch, as previously described, due to the limited accuracy of liquid etchings of noble metals;
- an interdiffusion and an electromigration of the noble metal covering the inserts. Thus, the interconnects end up being formed of a complex multilayer made of the insert material, of the noble metal, and of the pad material, which make interconnects very sensitive to solid/solid-type diffusion, to the creation of Kirkendall-type holes, and of holes at the interfaces of the areas made of different materials; and
- a crossed contamination of gold. Indeed, gold is a highly-doping material for the silicon usually present in electronic components. All the manufacturing steps using gold should thus be carried out in manufacturing areas different from those where exposed silicon is present.

The second variation provides a flip-chip hybridization by insertion of metal inserts into metal pads ensuring an electric connection without using noble metals.

Under the effect of the insertion into a pad, the different regions of an insert are deformed. Since it has a greater plasticity than the core, the first sub-layer will thus be more strongly deformed than the core during the penetration into a pad. Since, further, the second sub-layer has a lower plasticity than the first sub-layer, this second sub-layer cannot deform as much as the first sub-layer without breaking. Since it cannot follow the deformation undergone by the first sub-layer, the second sub-layer "cracks".

If the adherence of the second sub-layer to the first sub-layer is low, the second sub-layer "peels off" by sliding on the first sub-layer on insertion and remains outside of the pad, thus totally exposing the first sub-layer, which is non-oxidized, and thus is a good electric conductor.

If the adherence of the second sub-layer to the first sub-layer is strong, the second sub-layer also penetrates into the pad, with cracks due to the plasticity difference with the first sub-layer. The cracks thus define as many non-oxidized electric "paths" towards the first non-oxidized sub-layer, which are good electric conductors, thus providing a good electric conduction of the interconnect formed by the insert and the pad.

This result is obtained independently from the oxidizable nature of the first sub-layer which is thus advantageously selected from among non-noble materials. It is also not necessary to use a deoxidizing flow on insertion, since the electric paths have formed, and this, even if the second sub-layer is oxidized.

According to an embodiment, the adherence of the second sub-layer to the first sub-layer is low so that the second sub-layer slides on the first sub-layer under the effect of a shearing applied to the stack of the first and second sub-layers. Thereby, on insertion of the insert into a pad, the second sub-layer peels off and remains outside of the pad.

According to an embodiment, the first sub-layer is made of an oxidizable metal and the second sub-layer is made by oxidizing the first sub-layer to create a layer of native oxide of the metal of the first sub-layer having a plasticity lower than that of the first sub-layer.

"Native oxide layer" designates an oxide layer obtained by natural oxidation of the metal when in contact with oxygen.

The native oxide layer has the double property of being very brittle and of having a very low adherence to the metal from which it originates. Under the effect of the penetration of the insert into the pad, an "ice-on-mud" phenomenon can thus be observed, that is, the native oxide layer cracks in plates which slide on the first sub-layer during the insertion. The second sub-layer is thus "peeled off" and remains outside of the pad.

Further, the native oxide layer has the advantage of having a very small thickness, in the order of a few nanometers, totally defined by the nature of the metal. Thus, whatever the time of exposure of the first sub-layer to oxygen, the thickness of the second sub-layer remains constant.

Moreover, the electronic component provided with inserts can thus be stored in oxidizing conditions, such as air, for example, with no specific precaution.

Thus, the first sub-layer is not a noble metal and, additionally and preferably, it is made of oxidizable metals, in order to form a native oxide layer.

Advantageously, the first sub-layer is made of a metal selected from the group comprising aluminum, tin, indium, lead, silver, copper, zinc, and alloys based on these metals. These materials are advantageously very plastic, and can be used in low-cost processes exploitable for low interconnect pitches lower than 10 micrometers, or even than 5 micrometers. More specifically, the first sub-layer is made of aluminum, which also has the advantage of being a ductile material which, at the same time, keeps a constant hardness for a wide range of temperatures due to its high melting temperature, greater than 500° C.

The advantage of using a hollow insert is that this decreases the insert bearing surface on the pad, and thus eases the insertion, or even allows a cold insertion at ambient temperature. Due to the decreased bearing surface area, the surface pressure exerted on the surface of the first and second layers bearing on the pad is also increased, which facilitates the deformation of the first layer, and thereby the cracking of the second layer.

This also increases the shearing effect and helps peeling off the second layer in case of a low adherence thereof to the first layer. It should be noted that a cylindrical shape optimizes such effects, the hollow inserts thus advantageously having this shape.

According to a variation, the first sub-layer has a ductility substantially equal to that of the pads, which facilitates the deformation undergone by the first sub-layer on insertion, and thus also eases the cracking of the second sub-layer.

According to an embodiment, the method comprises:
  depositing a sacrificial layer on the connection surface of the first component;
  forming openings in the sacrificial layer vertically in line with the locations desired for the inserts;
  depositing a first metal layer at least in the opening to form the metal core for each insert;
  depositing a second metal layer at least in the openings to form a metal layer covering the core of each insert; and
  removing the sacrificial layer.

Not only does this method enable to manufacture inserts which are not surrounded with metal rings, but also does it enable to decrease the manufacturing cost. Indeed, the cost is mainly inherent to the number of manufacturing sequences requiring a change of material. In particular, in the manufacturing method described in relation with FIGS. 3 to 10, a first manufacturing sequence relative to the forming of openings 42 (FIG. 3), a second sequence relative to the deposition of the metal forming core 50 of inserts 16 (FIG. 4), a third sequence relative to the removal of sacrificial layer 40 (FIGS. 5 to 8), a fourth sequence relative to the deposition of the noble metal layer 52 (FIG. 9), and a fifth sequence relative to the removal of layer 52 of noble metal between inserts 16 (FIG. 10) can be observed. As will more easily be understood on reading of the following, the method according to the present invention only comprises three manufacturing sequences, which significantly decreases the manufacturing cost.

Another object of the invention is a method of face-to-face type hybridization of a microelectronic component obtained according to a method of the previously-mentioned type with a microelectronic component having, on one of its surfaces, respective conductive pads having a lower hardness than the metal core of the hollow inserts, comprising the insertion at ambient temperature of the inserts, provided with their second metal sublayer, into the pads.

Advantageously, the interconnect pitch between microcomponents is smaller than 10 micrometers.

According to an embodiment, the pressure exerted on a bearing surface of each insert during their insertion into the pads is greater than 1,800 megaPascals, which allows an efficient peeling-off of the oxide layer.

BRIEF DESCRIPTION OF THE DRAWINGS

The present invention will be better understood on reading of the following description provided as an example only in relation with the accompanying drawings, where the same reference numerals designate the same or similar elements, among which.

DETAILED DESCRIPTION OF THE INVENTION

A method according to the invention of manufacturing inserts for a flip-chip hybridizing of a first and of a second microelectronic components similar to that described in relation with FIGS. 1 and 2 will now be described in relation with FIGS. 14 to 18.

It should be noted that the inserts may take any shape, although inserts having a decreased bearing surface area, such as hollow cylinders, for example, are preferred to decrease the pressure necessary for their insertion into the pads. In the following, U-shaped cylindrical and hollow inserts will however be described, this shape being a preferred embodiment. However, it should be understood that considerations bearing on the materials forming the inserts and the pads are independent from the shape selected for them. For example, the inserts may be solid and/or have a triangular, square, and more generally polygonal, star, or other shape.

The method starts similarly to the manufacturing steps described in relation with FIGS. 3 and 4. Metal 44 forming core 50 of the inserts has a greater hardness than pads 18 to be insertable into them. For this purpose, central core 50 preferably has a Young's modulus greater than 1.5 time the Young's modulus of the material of pads 18.

Advantageously, metal 44 forming central core 50 is made of a hard metal, such as titanium nitride (TiN), tungsten nitride (NiW), copper (Cu), vanadium (V), molybdenum (Mo), nickel (Ni), titanium tungstenate (TiW), WSi, or tungsten (W), for example, and pads 18 are made of a ductile metal, for example, aluminum, tin, indium, lead, silver, copper, zinc, or an alloy of these metals.

Figure 14:
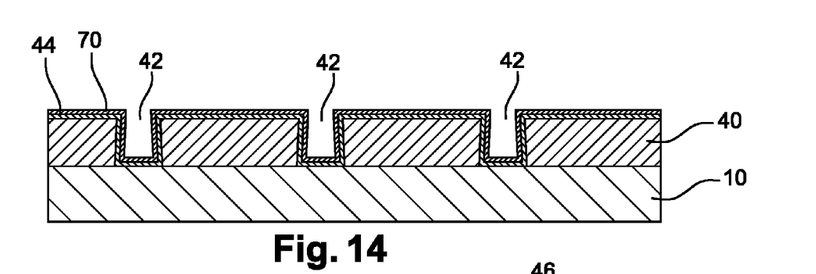
FIGS. 14 to 18 are simplified cross-section views illustrating a first method of manufacturing inserts according to the invention.
Figure 15:
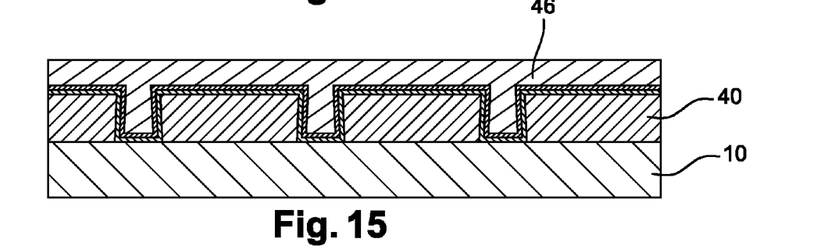
Figure 16:
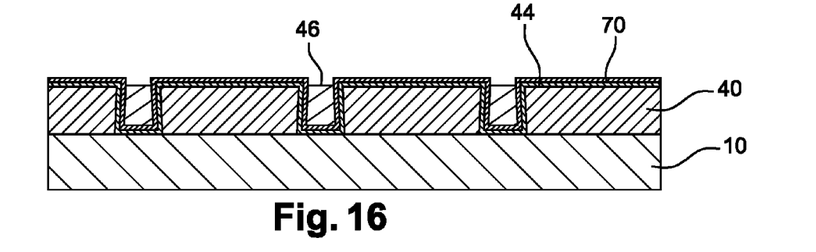
Figure 17:
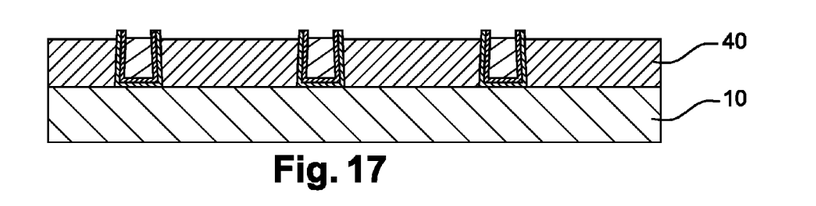

The method carries on with the full-plate deposition of a metal layer or multilayer 70 having the function of protecting the internal surface of central core 50 of the inserts from oxidation and optionally having a smaller electric resistivity than the metal 44, metal 44 forming the core remaining non-oxidized at this step of the method. The deposition for example is a chemical vapor deposition or CVD carried out at a temperature compatible with the microscopic elements of component 10, especially a temperature smaller than 425° C. for a component 10 implementing CMOS technology (FIG. 14).

Layer 70 is preferably made of aluminum, this metal having the advantage of having a very high melting temperature greater than 500° C.

A removal of the portion of hard metal 44 deposited between holes 42 is then performed, for example, by means of a damascene or gap-fill etching well known per se.

Figure 18:
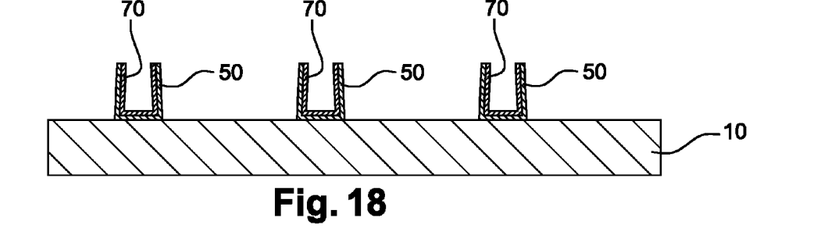

For example, a gap-fill etching similar to that described in relation with FIGS. 5 to 8 is implemented, comprising:
- the full-plate deposition of a fluid resin layer 46 (FIG. 15),
- the uniform etching of solidified layer 46 to reach the surface of metal layer 70 (FIG. 16),
- the etching of the stack of metal layers 44, 70 arranged between holes 42 (FIG. 17), and
- the removal of resin 46 contained in holes 42, followed by the removal of sacrificial layer 40 (FIG. 18).

The method thus comprises three manufacturing sequences, that is, a first manufacturing sequence relative to the forming of openings 42 (FIG. 3), a second sequence relative to the deposition of metals 44 and 70 (FIG. 14), a third sequence relative to the removal of sacrificial layer 40 (FIGS. 15 to 18).

Figure 19:
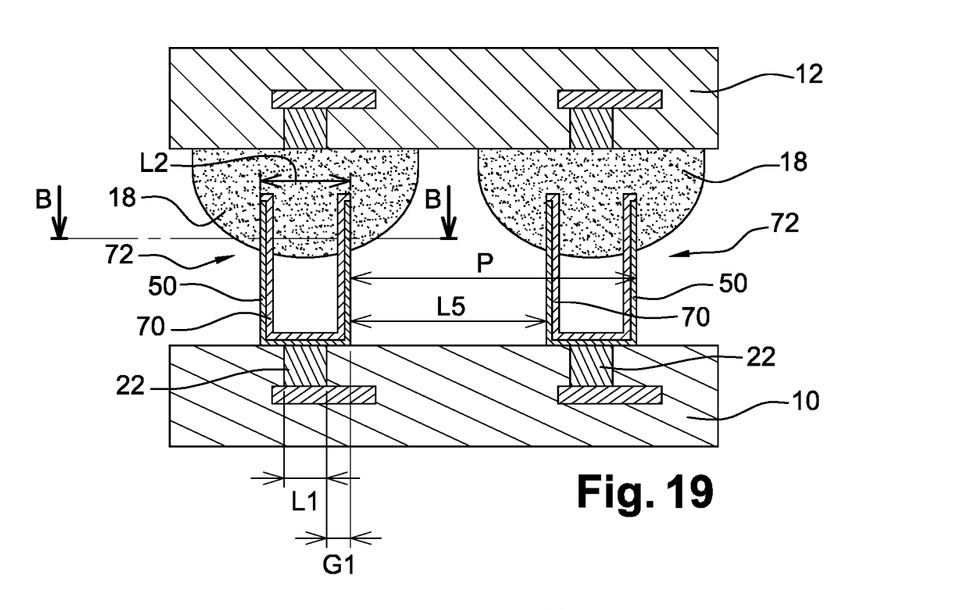
FIG. 19 is a cross-section view according to a first alternative embodiment of the invention of two adjacent inserts manufactured according to the method of FIGS. 14 to 18 and inserted into respective pads.
Figure 20:
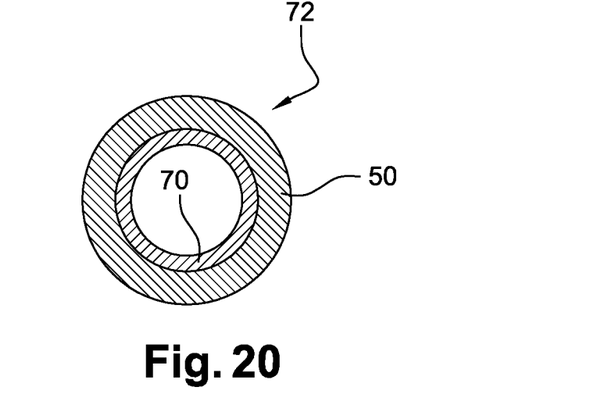
FIG. 20 is a simplified cross-section of an insert of FIG. 19 along plane B-B.

FIGS. 19 and 20 are simplified cross-section views illustrating inserts 72 manufactured according to the method just described. As illustrated, inserts 72 are formed of a central core 50, having only its internal surface covered with a metal layer of protection against oxidation 70.

Still with the simplified assumption of cylindrical connection areas 22 aligned with their respective inserts 16, the minimum interconnect pitch $\underline{P}$ obtained due to the invention is equal to the sum of width $\underline{L1}$ of connection area 22, of twice width $\underline{G1}$ between the external diameter of core 50 of an insert 16 and of width $\underline{L5}$ separating the external diameters of adjacent inserts 72, that is, $P=L1+2G1+L5$.

Taking the previously-described numerical examples, that is, a minimum value of $\underline{L1}$ equal to 3 micrometers, a minimum value of $\underline{G1}$ equal to 1 micrometer, and a value of $\underline{L5}$ equal to 3 micrometers, a minimum interconnect pitch $\underline{P}$ equal to 8 micrometers is obtained, that is, an interconnect surface density equal to approximately $1.625 \cdot 10^4$ interconnects/mm$^2$.

According to a first variation, metal layer 70 is made of a noble metal, such as gold or platinum, for example.

Figure 21:
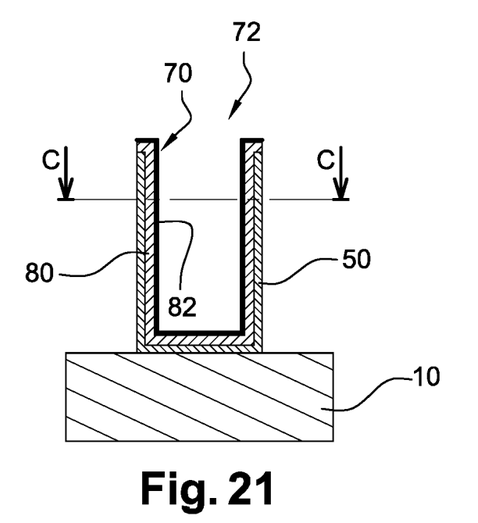
FIG. 21 is a cross-section view of an insert according to a second alternative embodiment of the invention.
Figure 22:
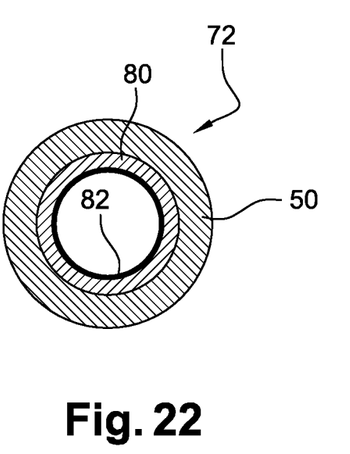
FIG. 22 is a simplified cross-section of an insert of FIG. 3 along plane C-C.
Figure 23:
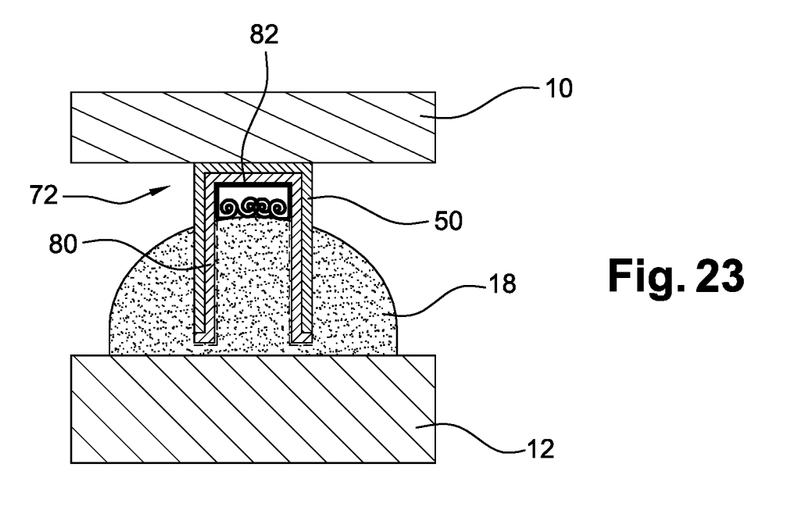
FIG. 23 is a simplified cross-section view illustrating the penetration of the insert of FIG. 21 into a ductile pad.

According to a second variation, illustrated in simplified cross-section view in FIGS. 21 and 22, metal layer 70 is formed of a first metal sub-layer 80 formed on core 50 of insert 72, sub-layer 80 being itself covered with a protection sub-layer 82.

First metal sub-layer 80, apart from being electrically conductive and from strongly adhering to central core 50 of insert 72 due to the metal-metal interface that it forms with core 50, has the function of deforming, while remaining attached to core 50, during the penetration of the insert into a pad 18. It has, for this purpose, a greater plasticity than core 50. Sub-layer 80 may thus be formed of a ductile metal. Particularly, a ductile metal having a Young's modulus greater than 1.5 time that of the material of core 50 has an appropriate plasticity.

Preferably, sub-layer 80 has a ductility substantially equal to that of pads 18 to enable the penetration of hard core 50 without breaking and obtain relative deformations of sub-layer 80 and of pad 18 in substantially equal fashion.

Sub-layer 80 is thus advantageously made of aluminum, tin, indium, lead, silver, copper, zinc, or an alloy of these metals. Further, metal sub-layer 80 is not oxidized.

Protection sub-layer 82 has as a first function to protect metal sub-layer 80 from oxidation and as a second function to expose at least a portion of metal sub-layer 80 on insertion of insert 72 into a pad 18 to create an electric connection between the material of pad 18 and central core 50. To achieve this, protection sub-layer 82 is selected to crack under the effect of the deformation of metal sub-layer 80. Protection sub-layer 82 thus has a lower plasticity than metal sub-layer 80.

Preferably, protection sub-layer 82 is selected to have a very low breakage threshold under deformation stress, that is, is very "brittle". Protection sub-layer 82 may be a protection film placed on metal sub-layer 80, such as for example an epoxy resist or a polymer layer such as parylene, for example, or a hard metal layer or a layer of hard and brittle insulator, such as for example $SiO_2$ or SiN.

Preferably, protection sub-layer 82 is made of the native oxide of the metal forming metal sub-layer 80, which has the triple advantage of:
- providing a very thin protection layer 82, in the order of a few nanometers,
- being hard and brittle, and especially having a plasticity and a ductility much lower than those of the actual metal 80, and
- having a very low adherence to metal sub-layer 80.

Further, this embodiment has the advantage that no specific measures are necessary to avoid the oxidation of inserts during their storage since inserts 72 are left to oxidize on purpose.

As illustrated in FIG. 22, during the penetration of insert 72 into pad 18, a deformation, even light, of metal sub-layer 80, breaks oxide layer 82 into plates, and, under the effect of shearing, the plates of native oxide slide on metal sub-layer 80 while remaining outside of pad 18. Oxide layer 82 is thus peeled off during the insertion, thus exposing metal sublayer 80, thereby creating a high-quality, and especially oxideless, electric connection.

A central core 50 non oxidized over its entire internal surface has been described. As a variation, only a portion of the internal surface of central core 50 is non-oxidized. Central core 50 is then covered with layer 70 at least on this non-oxidized portion. In the second variation, the sub-layer covers at least this non-oxidized portion and protection sub-layer 82 covers at least the portion of sub-layer 80 covering the non-oxidized portion of core 50, this portion of sub-layer 80 being non-oxidized.

As mentioned hereabove, inserts 72 are preferably hollow cylinders having very small bearing surfaces S (FIGS. 3 and 4), that is, to be able to perform a cold insertion, under ambient atmosphere, that is, under an ambient temperature much lower than the melting temperature of pads 18, for example, a temperature of approximately 300° K and under atmospheric pressure. Further, very small bearing surfaces result in increasing the stress exerted on the different regions of the inserts, and thus particularly the deformation and shear forces, which facilitates the cracking of protection sub-layer 82 as well as its peeling-off in the case of a protection layer of low adherence to metal sub-layer 80. Reference should advantageously be made to document FR 2 928 033 for the calculation of a bearing surface area allowing a cold insertion under ambient atmosphere.

Advantageously, the pressure exerted on bearing surface S on insertion of inserts comprising a first aluminum sub-layer 80 covered with a native oxide layer 82 (alumina $Al_2O_3$) in aluminum pads 18 is greater than 1,800 megaPascals. The inventors have indeed observed that for lower pressure values, the interconnects formed of inserts 16 in pads 18 have a high electric resistance, which means that the peeling-off of oxide layer 82 is not complete. The inventors have however observed that for the previous configuration of inserts and pads, pressures greater than 1,800 megaPascals (MPa) provide high-quality interconnects, that is, having an electric resistance close to that of aluminum, which means that the oxide layer has been almost fully peeled off.

Advantageously, the general insertion force or, equivalently, the general insertion pressure, exerted on circuits 10 and 12 to hybridize them, for example that exerted on circuit 10 such as illustrated by arrows in FIG. 1, and bearing surface S of the hollow cylinder, are thus selected to obtain the minimum pressure.

For example, a hollow cylinder having a diameter equal to 4 μm, with a wall thickness equal to 0.2 μm, has a bearing surface area S equal to 2.512 μm². When such an insert is submitted to a 5-mN insertion force, the pressure exerted on its bearing surface S is equal to 1,990 MPa.

Knowing the general insertion force and the number of interconnects between circuits 10 and 12, the unit insertion force applied to each insert 16 can be deduced. Knowing the unit insertion force, a maximum bearing area to obtain at least the minimum 1,800-MPa pressure can thus be deduced. Finally, bearing surface S of a hollow cylinder being provided by relation $S=2\times\pi\times(R_2-R_1)\times R_2$, where $R_2-R_1$ is the thickness of the walls of inserts 16 and $2\times R_2$ is the external diameter of inserts 16 (FIG. 4), thickness and diameter couples can easily be deduced. The selection of specific values for the thickness and the diameter can thus be performed according to other considerations, especially considerations relative to thicknesses that can be achieved according to the manufacturing method used or considerations relative to the mechanical robustness of inserts.

The invention claimed is:

1. A method of producing a hybridized device comprising two microelectronic components, including a first microelectronic component having conductive inserts on a connection surface, and a second microelectronic component having ductile conductive pads on one surface that is opposed to the connection surface of the first microelectronic device,
   wherein each conductive insert of the first microelectronic component comprises
      a hollow metal core formed of a bottom arranged on the connection surface and of a lateral wall protruding from said bottom, defining an internal surface of the insert, at least a portion of said internal surface being non-oxidized, and
      a metal layer substantially only covering the internal surface of the metal core and adapted to contact one of the ductile conductive pads of the second microelectronic component associated with the insert, the metal layer being made of an inoxidizable metal, or the metal layer comprising a first metal sub-layer non-oxidized over at least a portion of its surface, covering at least the non-oxidized portion of the internal surface of the core, wherein the first sub-layer has a greater plasticity than the core, and a second sub-layer covering at least the first sub-layer over its non-oxidized portion and having a lower plasticity than the first sub-layer, and
   wherein the pads of the second microelectronic component are made of a material with a lower hardness than that of the metal core of the hollow inserts of the first microelectronic component,
   the method comprising the steps of:
   hybridizing the first and second microelectronic components face-to-face by arranging the connection surface of the first microelectronic component to oppose the surface of the second microelectronic component having the ductile conductive pads; and
   establishing an electro-mechanical connection between the first microelectronic component and the second microelectronic component by inserting, at ambient temperature, the inserts of the first microelectronic component, provided with the second metal sub-layer, into the ductile conductive pads of the second microelectronic component.

2. The method of claim 1, wherein an interconnect pitch between the first and second microelectronic components is smaller than 10 micrometers.

3. The method of claim 1, wherein the first sub-layer is made of an oxidizable metal and wherein the second sub-layer is made by oxidizing the first sub-layer to create a layer of native oxide of the metal forming the first sub-layer having a plasticity lower than that of the first sub-layer.

4. The method of claim 3, wherein the first sub-layer is made of aluminum, and the second sub-layer is made of an aluminum oxide.

5. The method of claim 1, wherein the hollow metal core is made of a hard material.

6. The method of claim 5, wherein the hard material is selected from the group consisting of titanium nitride, tungsten nitride, copper, vanadium, molybdenum, nickel, titanium tungstenate, WSi, and tungsten.

7. The method of claim 1, wherein the adherence of the second sub-layer to the first sub-layer is low so that the second sub-layer slides on the first sub-layer under the effect of a shearing applied to the stack of the first and second sub-layers.

8. The method of claim 1, wherein the first sub-layer has a ductility substantially equal to that of the pads.

9. The method of claim 1, wherein the inoxidizable metal is a noble metal.

* * * * *